United States Patent
McGraw et al.

(10) Patent No.: US 8,909,512 B2
(45) Date of Patent: Dec. 9, 2014

(54) ENHANCED STABILITY PREDICTION FOR INCREMENTALLY GENERATED SPEECH RECOGNITION HYPOTHESES BASED ON AN AGE OF A HYPOTHESIS

(75) Inventors: Ian C. McGraw, Morgantown, WV (US); Alexander H. Gruenstein, Sunnyvale, CA (US)

(73) Assignee: Google Inc., Mountain View, CA (US)

( * ) Notice: Subject to any disclaimer, the term of this patent is extended or adjusted under 35 U.S.C. 154(b) by 352 days.

(21) Appl. No.: 13/461,033

(22) Filed: May 1, 2012

(65) Prior Publication Data
US 2013/0110492 A1    May 2, 2013

Related U.S. Application Data

(60) Provisional application No. 61/554,039, filed on Nov. 1, 2011.

(51) Int. Cl.
| | |
|---|---|
| G06F 17/28 | (2006.01) |
| G06F 17/27 | (2006.01) |
| G10L 15/08 | (2006.01) |
| G10L 15/22 | (2006.01) |

(52) U.S. Cl.
CPC .............. *G10L 15/08* (2013.01); *G06F 17/289* (2013.01); *G10L 2015/223* (2013.01)
USPC ................................................. 704/2; 704/9

(58) Field of Classification Search
CPC ........................... G06F 17/289; G06F 17/2785
USPC .................................................. 704/2, 9, 251
See application file for complete search history.

(56) References Cited

U.S. PATENT DOCUMENTS

| | | | |
|---|---|---|---|
| 6,393,398 B1 | 5/2002 | Imai et al. | |
| 2005/0055210 A1* | 3/2005 | Venkataraman et al. | ..... 704/255 |
| 2007/0271088 A1* | 11/2007 | Waibel et al. | ...................... 704/9 |
| 2010/0094632 A1* | 4/2010 | Davis et al. | ................... 704/260 |
| 2011/0231183 A1* | 9/2011 | Yamamoto et al. | ............... 704/9 |
| 2012/0095766 A1* | 4/2012 | Han et al. | ...................... 704/255 |

OTHER PUBLICATIONS

"Stability and Accuracy in Incremental Speech Recognition" by Selfridge et al. The 12th Annual Meeting of the Special Interest Group on Discourse and Dialogues, Jun. 17-18, 2011 Oregon Science & Health University, Portland, Oregon. 10 pages.
"Assessing and Improving the Performance of Speech Recognition for Incremental Systems" by Baumann et al., Institut fur Linguistik, Universitat Potsdam, Potsdam, Germany, Human Language Technologies: The 2009 Annual Conference of the North American Chapter of the ALC, pp. 380-388, Boulder, Colorado, Jun. 2009.
"Incremental Dialogue System Faster than and Preferred to its Nonincremental Counterpart" by Aist et al., Proceedings of the 29th Annual Conference of the Cognitive Science Society, pp. 761-766, Aug. 1-4, 2007.

(Continued)

*Primary Examiner* — Farzad Kazeminezhad
(74) *Attorney, Agent, or Firm* — Fish & Richardson P.C.

(57) ABSTRACT

Methods, systems, and apparatus, including computer programs encoded on a computer storage medium, for predicting the stability of speech recognition results. In one aspect, a method includes determining a length of time, or a number of occasions, in which a word has remained in an incremental speech recognizer's top hypothesis, and assigning a stability metric to the word based on the length of time or number of occasions.

29 Claims, 8 Drawing Sheets

(56) References Cited

OTHER PUBLICATIONS

Notification and Transmittal of the International Search Report and the Written Opinion of the International Searching Authority or the Declaration issued in PCT/US2012/050612 on Oct. 26, 2012.

Imai, T. et al., "Progressive early decision of speech recognition results by comparing most likely word sequences", Systems and Computers in Japan, Wiley, Hoboken, NJ, US, vol. 34, No. 14, Dec. 1, 2003, pp. 73-82.

Fink, G. A. et al., "Incremental speech recognition for multimodal interfaces", Industrial Electronics Society, 1998. IECON '98. Proceedings of the 24th Annual Conference of the IEEE, Aachen, Germany, Aug. 31-Sep. 4, 1998, New York, NY, USA, IEEE, US, vol. 4, Aug. 31, 1998, pp. 2012-2017.

\* cited by examiner (1)
(10)   tea for
(20)   peter
(30)   peter piper
(40)   peter piper puck
(50)   peter piper picked
(60)   peter pipe per picked a
(70)   peter piper picked a stack
(80)   peter piper picked the speck of
(90)   peter piper picked a peck of pickles
(100)  peter piper picked a peck of pickled peppers

ENHANCED STABILITY PREDICTION FOR INCREMENTALLY GENERATED SPEECH RECOGNITION HYPOTHESES BASED ON AN AGE OF A HYPOTHESIS

CROSS-REFERENCE TO RELATED APPLICATION

This application claims the benefit of U.S. Provisional Patent Application No. 61/554,039, filed Nov. 1, 2011, which is incorporated herein by reference.

TECHNICAL FIELD

This specification generally relates to speech recognition.

BACKGROUND

In certain automated speech recognition (ASR) implementations, a user finishes speaking before recognition results are displayed or acted upon.

SUMMARY

In incremental speech recognition, partial results can be streamed out from a recognizer while the user is speaking, thereby enabling, for example, a number of useful features for spoken language interfaces. For example, the recognizer can act on or show the user a hypothesis before it is fully formed. Additionally, pre-computing responses before a recognition result is fully settled can have computational advantages. Along with these and other useful features, a spoken language interface can feel more natural and responsive to the user.

According to one general implementation of the subject matter described by this specification, a system can assign stability metrics to segments of incremental speech recognition results based on a variety of features, for example duration-related features. Instead of or in addition to estimating the probability that the segment has been correctly decoded by the recognizer, the system can estimate the probability that segments in the incremental results, up to and including the most recently decoded segment, are stable, i.e., will remain in future incremental results without changing. Segments that exhibit desirable stability characteristics can, for example, be displayed to a user.

In general, one aspect of the subject matter described in this specification may be embodied in methods that include the actions of receiving multiple, partial incremental speech recognition hypotheses that each represent an incremental speech recognizer's top incremental speech recognition hypothesis at a different point in time, and identifying a segment from one of the multiple, partial incremental speech recognition hypotheses. The method also includes determining, from the multiple, partial incremental speech recognition hypotheses, how long the segment has persisted in the incremental speech recognizer's top incremental speech recognition hypothesis, and assigning, by one or more computers, a stability metric to the segment based on how long the segment has persisted in the incremental speech recognizer's top incremental speech recognition hypothesis.

In general, another aspect of the subject matter described in this specification may be embodied in methods that include the actions of identifying a word or a sub-word that occurs in an output of a speech recognizer at a particular point in time, determining an earliest point in time in which the word or sub-word had occurred, without later changing, in the output of the speech recognizer, and calculating an age metric for the word or sub-word based on the particular point in time and the earliest point in time.

In general, another aspect of the subject matter described in this specification may be embodied in methods that include the actions of determining a length of time, or a number of occasions, in which a word has remained in an incremental speech recognizer's top hypothesis, and assigning a stability metric to the word based on the length of time or the number of occasions.

Other embodiments of these aspects include corresponding systems, apparatus, and computer programs, configured to perform the actions of the methods, encoded on computer storage devices.

These and other embodiments may each optionally include one or more of the following features. For instance, assigning the stability metric to the segment is further based on a right context of the segment; the segment is a word or sub-word; determining how long the segment has persisted includes determining how long the segment has persisted without changing; the stability metric is assigned to the segment after the identified, particular incremental speech recognition hypothesis that includes the segment has been output from the incremental speech recognizer; the method includes receiving an audio signal corresponding to an utterance, and performing incremental speech recognition on the audio signal to generate the multiple, partial incremental speech recognition hypotheses; the method includes determining whether the stability metric satisfies a threshold, and altering a visual characteristic of a representation of the segment on a user interface based on determining whether the stability metric satisfies the threshold; the method includes determining whether the stability metric satisfies a threshold, and translating the segment to a different language based on determining whether the stability metric satisfies the threshold; the method includes determining whether the stability metric satisfies a threshold, and submitting the segment to a search engine as part of a search query based on determining whether the stability metric satisfies the threshold; the method includes determining whether the stability metric satisfies a threshold, and displaying a representation of the segment on a user interface based on determining whether the stability metric satisfies the threshold; and/or the receiving, identifying, determining and assigning are performed by one or more computers.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF DRAWINGS

Like reference symbols in the various drawings indicate like elements.

DETAILED DESCRIPTION

Figure 1:
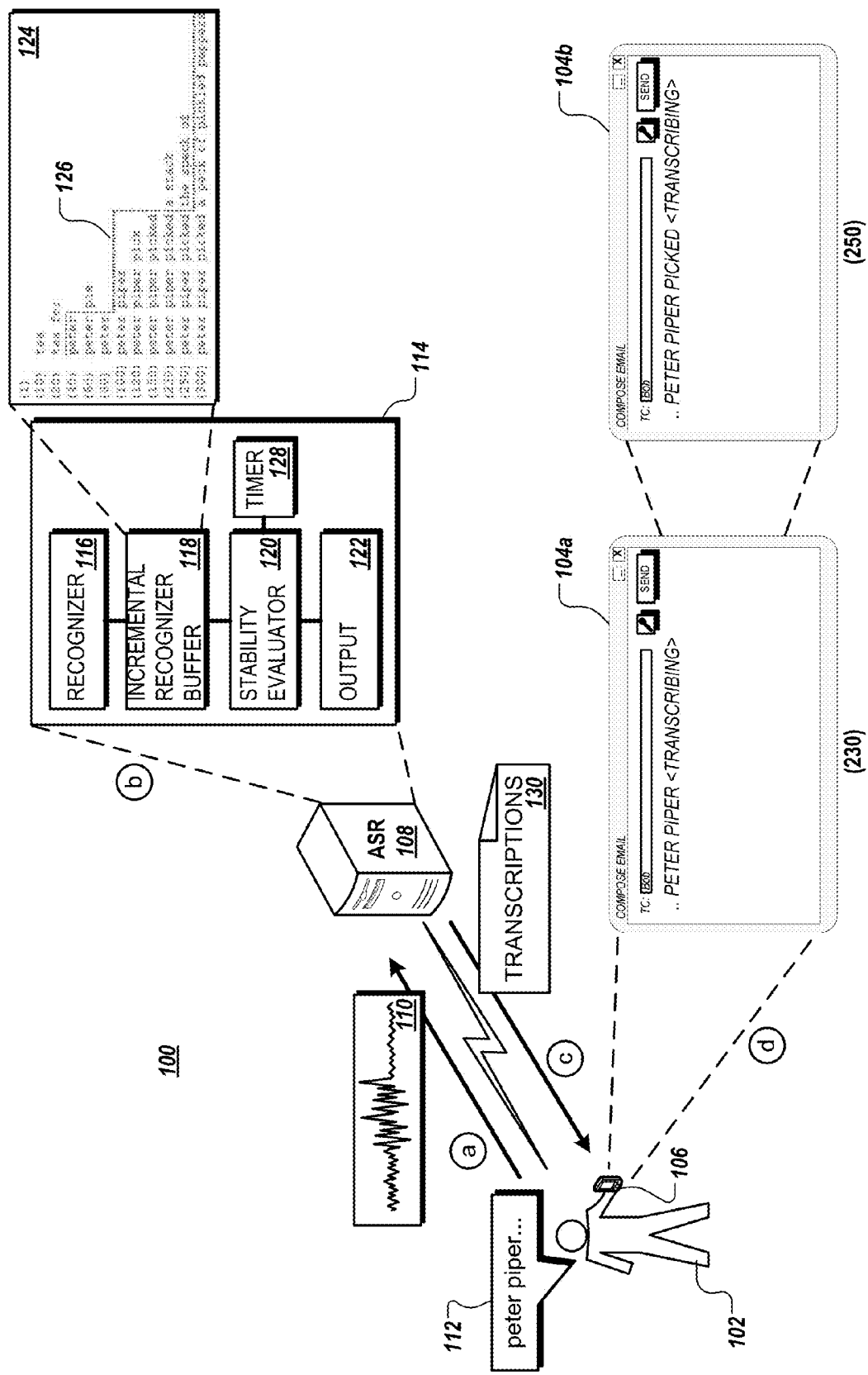
FIG. 1 is a diagram of an example system that can evaluate a stability of incrementally generated speech recognition hypotheses.

FIG. 1 is a diagram of an example system 100 that can evaluate a stability of incrementally generated speech recognition hypotheses. For example, the example system 100 can incrementally generate speech recognition hypotheses from utterance 112 made by a user 102, evaluate a stability of segments within the hypotheses, and output segments that satisfy a stability threshold. FIG. 1 also illustrates an example of a flow of data within the system 100 during states (a) to (d), and a user interface 104a, b displayed on a user device 106 during state (d). The states (a) to (d) may be time-sequenced states, or they may occur in a sequence that is different than the illustrated sequence.

In further detail, the system 100 includes a user device 106 that is in communication with an automated speech recognition (ASR) engine 108. The user device 106 may be any appropriate type of computing device, including but not limited to a mobile phone, smart phone, PDA, music player, e-book reader, tablet computer, laptop or desktop computer, or other stationary or portable device, that includes one or more processors and computer readable media. The ASR engine 108 may be a component of the mobile device 106. In some implementations, the ASR engine 108 may be external to the user device 106, and communication between the user device 106 and the ASR engine 108 may take place over phone and/or computer networks including a wireless cellular network, a wireless local area network (WLAN) or Wi-Fi network, a Third Generation (3G) or Fourth Generation (4G) mobile telecommunications network, or any appropriate combination thereof.

Referring to the example flow of data, during state (a), an audio signal 110 is sent to the ASR engine 108. For example, when the user 102 begins to utter a sentence (e.g. "peter piper picked a peck of pickled peppers"), the utterance 112 is encoded and communicated to the ASR engine 108 as audio signals 110. In some implementations, the utterance 112 may represent voice-based input to the user device 106, for example in composing email. Additionally, or alternatively, the utterance 112 may represent input sent to a search engine, a dictation engine, a dialogue system, or any other engine or system that uses transcribed speech, or that invokes a software application that uses transcribed speech, to perform some action.

During state (b), the ASR engine 108 receives and processes the audio signal 110. The ASR engine 108 may be configured to execute application code associated with a variety of software components (e.g., modules, objects, libraries, services, and the like) for implementing a stable segment generation system 114, including a recognizer 116, an incremental recognizer buffer 118, a stability evaluator 120, and an output module 122.

As the ASR engine 108 receives the audio signal 110, the recognizer 116 incrementally recognizes and converts the utterance 112 into text. The incrementally converted text may represent a top incremental speech recognition hypothesis of the recognizer 116 and can be stored in the incremental recognizer buffer 118. In the example system 100, the incremental recognizer buffer 118 keeps track of top incremental speech recognition hypotheses 124 as they become available from the recognizer 116 over time. As described in greater detail below, the stability evaluator 120 then incrementally identifies segments of the top incremental speech recognition hypotheses 124 and determines the stability of each segment. A segment that the stability evaluator 120 has evaluated to be stable is sent to the output module 122. Here, a segment, or prefix, may refer to a sub-word, a word, or a group of words.

For the top incremental speech recognition hypotheses 124 shown in FIG. 1, a segment at a particular time frame (illustrated as, for example, time-sequenced time frame in milliseconds (1), (10), (20), etc.) can be said to exhibit desirable stability characteristics if all future incremental results include the same segment. For example, a best path line 126 indicates an outline of stable segments that do not change as subsequent incremental segments are added to the top hypotheses 124. In some implementations, the stability evaluator 120 can use a timer 128 to measure how long a particular word has persisted (i.e. persistence or age) in the top hypothesis, and a stability metric can then be assigned based on this measurement. For example, the stability evaluator 120 may be configured to determine that a particular word or segment is stable if it has persisted in the top hypotheses 124 for 100 ms or more without changing. Other stability metrics and methods for establishing stability can be used by the stability evaluator 120 as discussed further below.

During state (c), one or more stable segments from output 122 are communicated to the user device 106 as transcriptions 130. The transcriptions 130 may be sent to the user device 106 at pre-determined time intervals, or in real-time as stable segments within the top incremental speech recognition hypotheses 124 are identified by the stable segment generation system 114 of the ASR engine 108. In some implementations, the transcriptions 130 may include both stable and unstable segments of the top hypotheses 124.

During state (d), the user interface 104a, b displays the transcriptions 130 that are received by the user device 106. In the example shown, the user interface 104a, b incrementally displays only the segments within the top hypotheses 124 that the stability evaluator 120 has determined to be stable. For the example stability threshold of 100 ms or greater mentioned above, the user interface 104a indicates that "PETER PIPER" is stable at time (230). This is because, although the recognizer 116 has generated at time (230) a hypothesis of "peter piper picked a stack," only "peter" and "piper" have persisted in the top hypotheses 124 for 100 ms or more without changing (190 ms and 130 ms respectively). Similarly, the user interface 104b indicates that "PETER PIPER PICKED" is stable at time (250) since only "peter," "piper," and "picked" have persisted in the top hypotheses 124 for 100 ms or more without changing (210 ms, 150 ms, and 100 ms, respectively). Additionally, or alternatively, the user interface 104a, b can display the entire top incremental hypothesis at a specific time frame while visually differentiating between stable and unstable portions. For example, words with a high stability can be shown in black, while words of a low stability can be shown in grey. In some implementations, a darkness of the displayed words can vary in response to the particular stability value of the word.

Figures 2A, 2B:
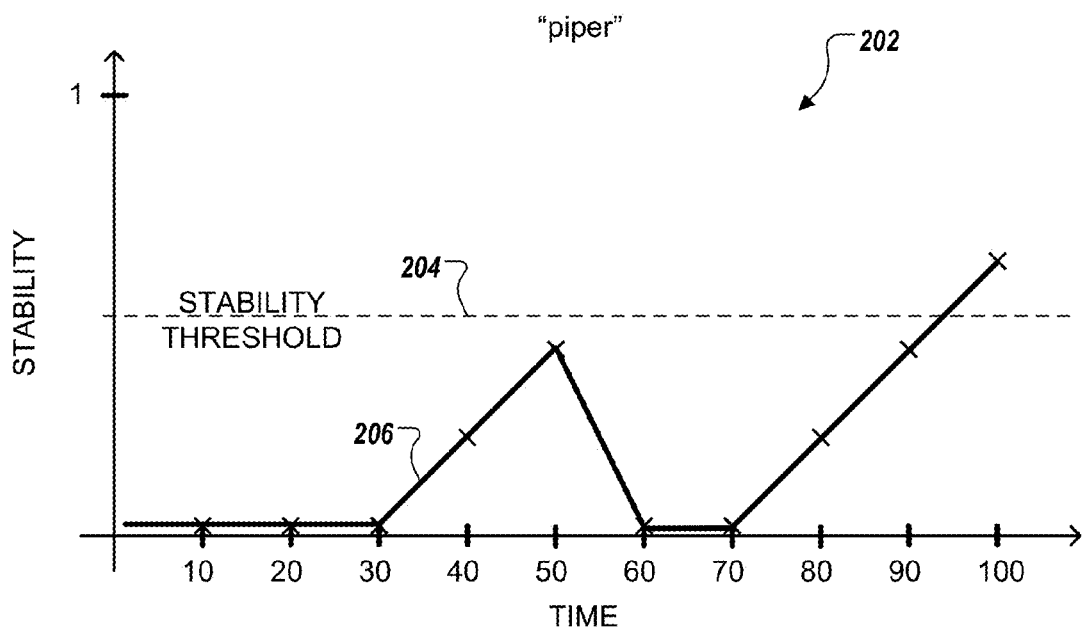
FIG. 2A is an example of top hypotheses generated by an incremental speech recognizer at various times.
FIG. 2B illustrates a sample process for determining whether a stability metric corresponding to a segment from the top hypotheses of FIG. 2A satisfies a threshold.

FIG. 2A is an example of top hypotheses 200 generated by an incremental speech recognizer at various times. For example, a sentence (e.g. "peter piper picked a peck of pickled peppers") uttered by the user 102 may be incrementally decoded by the recognizer 116 and stored as top hypotheses 200 in the incremental recognizer buffer 118 as described above with respect to top hypotheses 124 shown in FIG. 1. Top hypotheses 200 include a top incremental hypothesis at a particular time frame (for example, time-sequenced time frames (1), (10), (20), etc. measured in milliseconds).

FIG. 2B illustrates a sample process for determining whether a stability metric corresponding to a segment from the top hypotheses 200 of FIG. 2A satisfies a threshold. As an example, a stability evaluation plot 202 illustrates a time-dependent change of a sample stability metric corresponding to the word "piper" from the top hypotheses 200 of FIG. 2A.

In the example plot 202, a stability curve 206 represents a stability of the word "piper" at various times during the incremental speech recognition process. Here, the stability, or stability metric, of a word or segment within the top hypotheses 200 is evaluated, for example by the stability evaluator 120 and the timer 128 shown in FIG. 1, by measuring how long the word or segment has persisted in the top hypotheses 200 without changing. In some implementations, the stability metric may further take into account measurements other than the age or persistence of the segment. For example, as discussed further below, the stability metric may be evaluated based on the persistence as well as a right context of the segment, where right context refers to a total time elapsed since the segment was first recognized.

Referring to both FIGS. 2A and 2B, the word "piper" has not yet been recognized at times (10) and (20). As a result, the stability curve 206 indicates a minimum stability value (e.g. zero or null) during this time interval. At time (30), the word "piper" is recognized for the first time, but the stability curve 206 still indicates the minimum stability value at this time since the word has not yet persisted for any span of time within the top hypotheses 200. At time (40), "piper" has now persisted in the top hypotheses 200 for 10 ms without changing. The resulting increase in stability is indicated as a rise in the stability curve 206 at time (40). Similarly, at time (50), "piper" has persisted in the top hypotheses 200 for 20 ms without changing. As a result, the stability curve 206 continues to increase at time (50). While the example plot 202 shows the stability threshold as being sampled in 10 ms intervals, stability may be evaluated more or less frequently depending, for example, on the constraints and/or requirements of the ASR engine 108.

In the top hypotheses 200 at time (60), the previously recognized word "piper" has been updated to "pipe per." As a result, the stability curve 206 drops back down to the minimum stability value at time (60) since the word "piper" no longer appears in the top hypothesis. At time (70), the word "piper" is recognized again. Even though the word "piper" was recognized as early as time (30) before being recognized again at time (70), the stability value associated with the word "piper" is not above the stability threshold at time (70) because "piper" changed to "pipe per" at time (60), thus resetting the associated persistence value, before changing back to "piper" at time (70). After being recognized at time (70), the word "piper" remains in the top hypotheses 200 until time (100). As a result, the stability curve 206 begins to rise at time (70) and continues to do so until time (100). Based on a stability threshold indicated by a stability threshold line 204, the word "piper" is evaluated to be stable for the first time sometime between time (90) and time (100) where the stability curve 206 crosses the stability threshold line 204. Once the stability of the word or segment surpasses the stability threshold, the particular word or segment can be considered to be stable, regardless of whether or not the recognized word or segment has been correctly recognized by the recognizer 116 as intended by the user 102.

Figure 3:
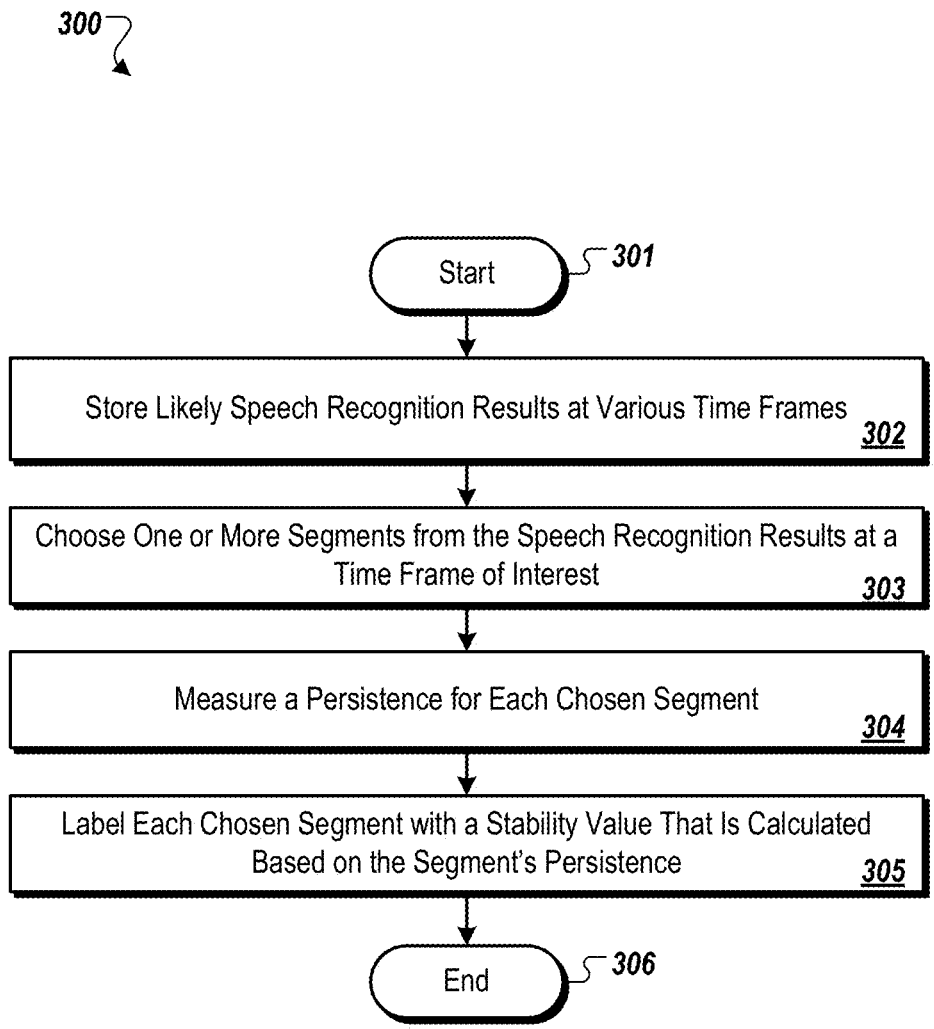
FIG. 3 is a flowchart of an example process for assigning a stability metric to a segment based on its persistence.

FIG. 3 is a flowchart of an example process 300 for assigning a stability metric to a segment based on its persistence. Briefly, the process 300 includes storing likely speech recognition results at various time frames (302), choosing one or more segments from the speech recognition results at a time frame of interest (303), measuring a persistence for each chosen segment (304), and labeling each chosen segment with a stability value that is calculated based on the segment's persistence (305). In some implementations, the process 300 may be performed by the system 100 and will be described as such below for purpose of clarity.

In more detail, the process 300 begins (301) when the audio signal 110 is received by the ASR engine 108 and decoded by the recognizer 116. The top hypothesis at each time frame is then received by the incremental speech recognizer buffer 118 and stored as top incremental speech recognition hypotheses, which reflect the most likely speech recognition results at each time frame (302).

At a time frame of interest, one or more segments are identified from among the top incremental speech recognition hypotheses (303). For example, each word in a top hypothesis at a particular time frame can be individually chosen as multiple segments. Alternatively, or additionally, a group of words appearing in the top hypothesis can be collectively chosen as a single segment.

How long the one or more segments have persisted in the top hypotheses is determined (304). As discussed above with respect to FIG. 1, the persistence of a segment can be obtained by measuring the time interval between the time frame of interest at which the segment is identified and the time frame at which the segment first appeared in the top hypotheses without subsequently changing. For example, briefly referring back to FIG. 2A, the identified segment of "piper" first appears in the top hypothesis at time (30) but subsequently changes to "pipe per" at time (60). It is not until time (70) when "piper" appears again in the top hypothesis that the segment can be considered to have first appeared without subsequently changing. In some implementations, the persistence of a segment may be obtained by counting the number of times the segment occurred in the top hypotheses between a frame of interest at which the segment is identified and an earlier frame at which the segment first appeared in the top hypotheses without subsequently changing.

The one or more segments chosen in (303) are each assigned a stability metric based on the persistence measurement (305). Additionally, other duration-related features of the segment, such as its right context, may be used to assign the stability value to the segment. Features of the segment that are not duration-related may also be used in assigning the stability value. In some implementations, a simple weighted interpolation between the various duration-related features of the segment, both duration-related and otherwise, may be used. Alternatively, as described further below, a regression, for example a logistic regression, can be used to estimate the stability of a segment given its various features. The process 300 can end (306) when a segment that has been evaluated to be stable is sent to the output module 122.

Figure 4:
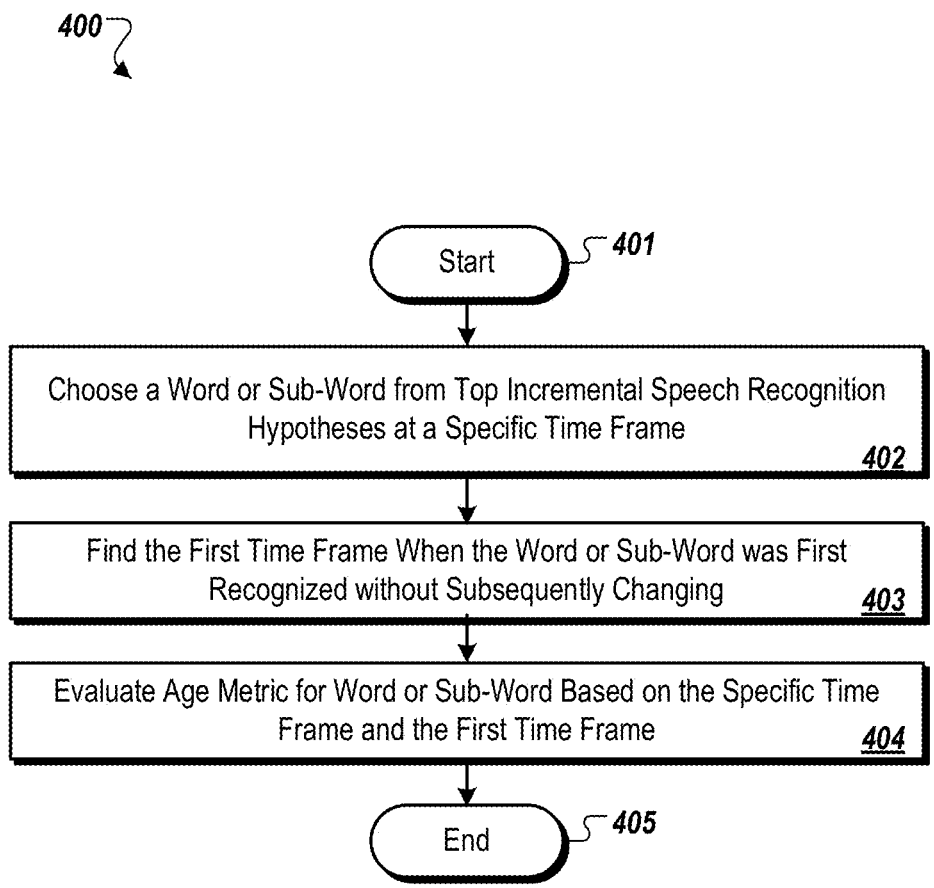
FIG. 4 is a flowchart of an example process for calculating an age metric for a word or sub-word based on a time at which the word or sub-word was first recognized without later changing.

FIG. 4 is a flowchart of an example process 400 for calculating an age metric for a word or sub-word based on a time at which the word or sub-word was first recognized without later changing. Briefly, the process 400 includes choosing a word or sub-word from the top incremental speech recognition hypotheses at a specific time frame (402), finding the first time frame when the word or sub-word was first recognized without subsequently changing (403), and evaluating an age metric for the word or sub-word based on the specific time frame and the first time frame (404). In some implementations, the process 400 may be performed by the system 100 and will be described as such below for purpose of clarity.

In greater detail, the process 400 begins (401) as the recognizer 116 begins to decode the audio signal 110 into incremental speech recognition hypotheses. As described above with respect to FIG. 3, decoded output from the recognizer 116 can be stored in the incremental recognizer buffer 118 at incremental time frames.

At a time frame of interest, a word or sub-word, or a group of words of sub-words, occurring in the output of the recognizer 116 is identified (402). For example, each word or sub-word in the incremental output at a particular time frame can be individually identified. Alternatively, or additionally, a group of words or sub-words in the incremental output can be collectively identified.

An earliest point in time at which the above-identified word or sub-word occurred in the output without later changing prior to being identified in (402) is determined (403). For example, if the word or sub-word was identified at time (80), first occurred at time (20), became modified to another word or sub-word at time (40), and later changed back to the identified word or sub-word at time (60), time (60) is determined to be the earliest point in time at which the word or sub-word occurred without later changing. In this example, the persistence of the word or sub-word would be (80)–(60), or 20 ms.

An age metric is calculated for the identified word or sub-word based on the particular time frame of interest and the earliest point in time (404). For example, if the age metric is calculated by finding the time difference between the particular time frame and the earliest time frame, the age metric is equal to the age or persistence of the identified word or sub-word at the particular time frame. In some implementations, the age metric is equal to the stability metric. Alternatively, the age metric can be combined with other metrics to formulate the stability metric. The process 400 can end (405) when the age metric for all words or sub-words within the incremental hypotheses at a particular time frame has been calculated.

Figure 5:
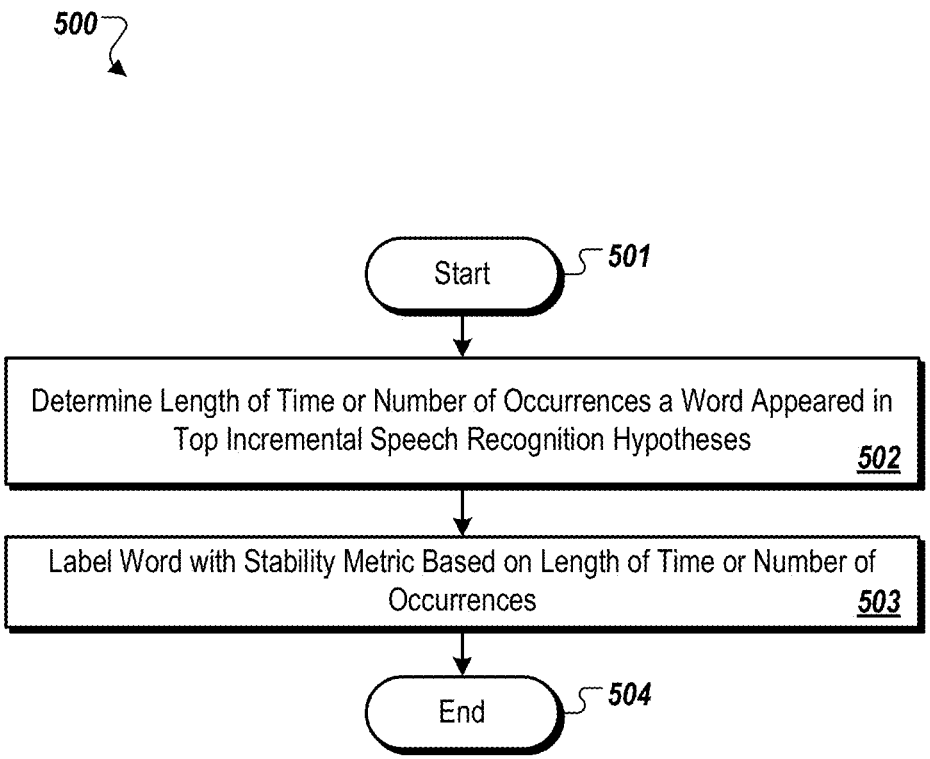
FIG. 5 is a flowchart of an example process for assigning a stability metric to a word based on its length of time.

FIG. 5 is a flowchart of an example process 500 for assigning a stability metric to a word based on its length of time. Briefly, the process 500 includes determining a length of time or a number of occurrences a word appeared in the top incremental speech recognition hypotheses (502), and labeling the word with a stability metric that is based on the length of time or the number of occurrences (503). In some implementations, the process 500 may be performed by the system 100 and will be described as such below for purpose of clarity.

In more detail, the process 500 begins (501) when a word within the top incremental speech recognition hypotheses is identified as in (303) and (402). A length of time that the word has remained in the top hypotheses or a number of occasions that the word showed up in the top hypotheses is determined (502). In contrast to the age or persistence of the word, the associated length of time measures a total length of time that the word has appeared in the top hypotheses. For example, if the word or sub-word was identified at time (80), first occurred at time (20), became modified to another word or sub-word at time (40), and later changed back to the identified word or sub-word at time (60), the length of time that the identified word or sub-word has remained in the top hypotheses would be [(40)–(20)]+[(80)–(60)], or 40 ms. The number of occasions measurement is generally a non-time-dependent feature that counts the number of times that a particular word has appeared in the top hypotheses.

The word from (502) is assigned a stability metric based on the calculated length of time (503). Additionally, other duration-related features of the word, such as its persistence and/or right context, may be used to assign the stability value to the word. The process 500 can end (504) when the word and its stability metric is sent to the output module 122.

In the sample processes described above with respect to FIGS. 1-5, when given a set of features associated with a prefix within the incremental hypotheses, a regression can be used to estimate the probability that a prefix of an incremental result is stable. For example, a logistic regression can be used. Given data of the form $<w_t, y_t>$ where $w_t$ is a word within the incremental hypotheses and $y_t$ is a binary response, a feature vector $f(w_t)$ of size M can be populated to train a set of parameters $\beta \in \mathbb{R}^M$. A single frame can be randomly sampled from each of the hypothesized words in the incremental results of a training set, and features $f(w_t)$ can be computed at that frame. A binary response $y_t$ can be recorded to represent a true stability of the prefix ending in $w_t$.

Once the parameters are trained, the stability statistic, s, can be predicted by using Equation (1):

$$s = \text{logit}^{-1}(\beta f(w_t)). \tag{1}$$

The stability evaluator 120 can then use a stability threshold to extract stable prefixes of incremental results. To prevent spurious deletions that may occur if a stability oscillates around the threshold, a design decision can be made regarding whether to allow the stability of a word to decrease over time. Alternatively, or additionally, a design decision can be made to ensure that stabilities decrease from left to right in an incremental result.

Figure 6:
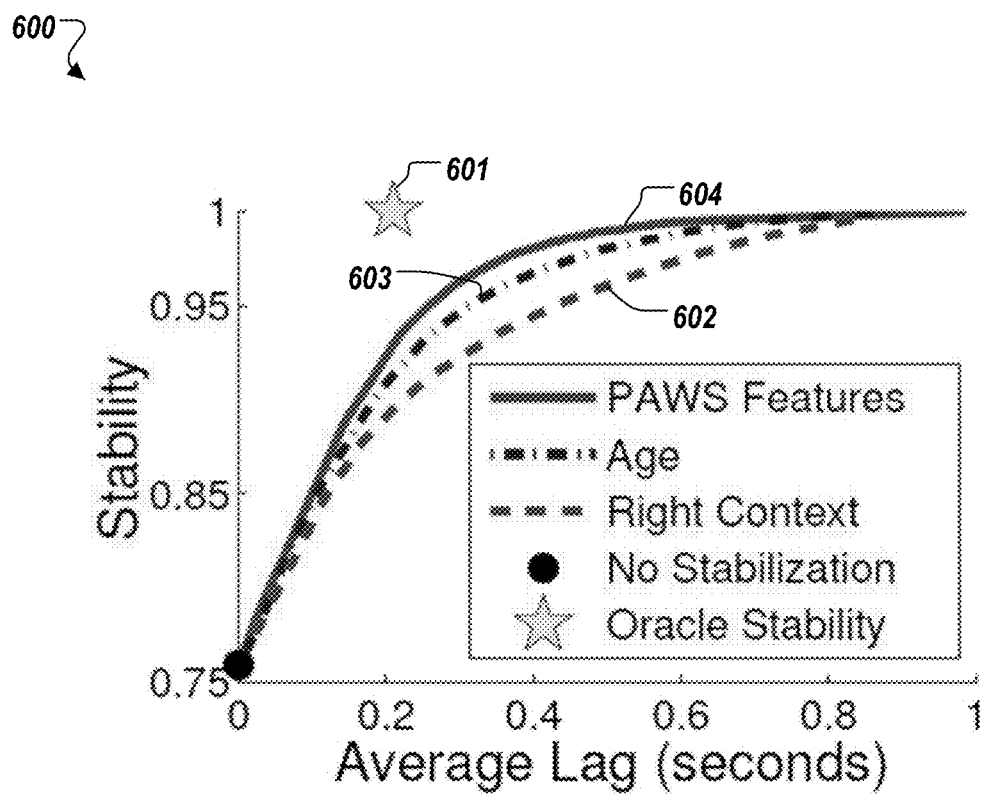
FIGS. 6 and 7 illustrate a stability improvement as a function of lag for sample test sets.
Figure 7:
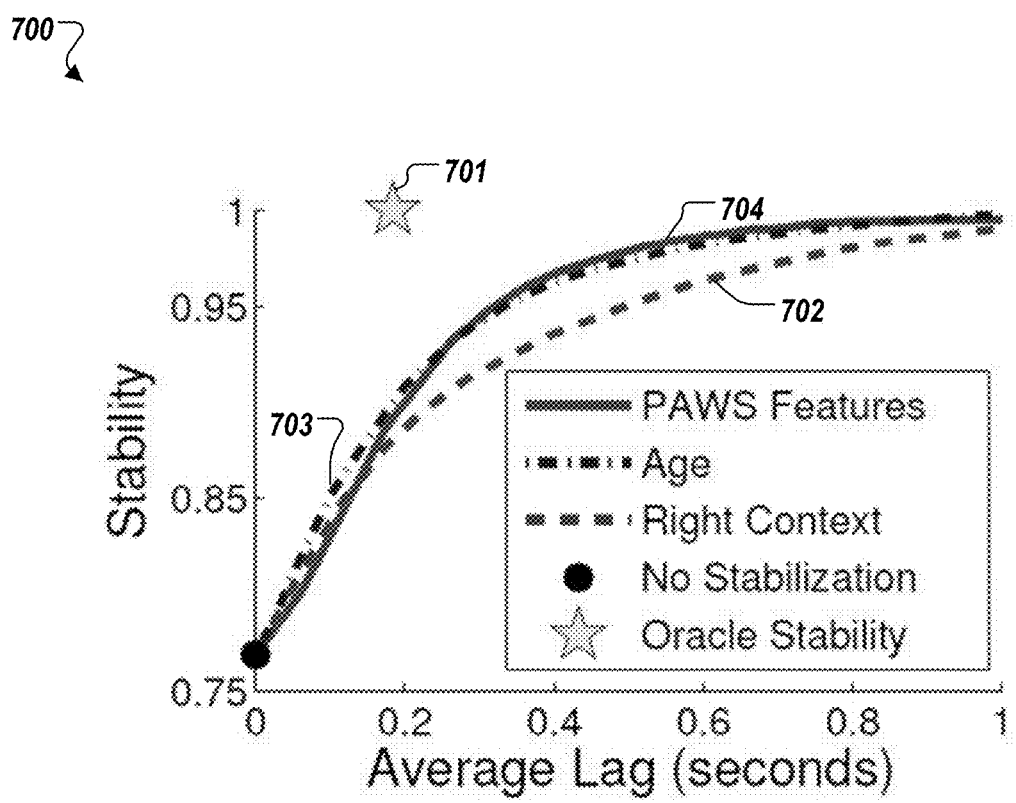

FIGS. 6 and 7 illustrate a stability improvement as a function of lag for sample test sets. Even under ideal speech recognition conditions, there can be some degree of lag between a time when a word is spoken by the user 102 and a time when the word becomes available from the recognizer 116. Plot 600 of FIG. 6 reflects a sample test set that represents, for example, utterance 112 made by a user 102 in performing a voice-based search on a computer, mobile device, or the like. Plot 700 of FIG. 7 reflects a sample test set that represents, for example, utterance 112 made by a user 102 in providing voice-based input to a computer, mobile device, or the like. Example utterances in the sample from FIG. 6 are generally longer than example utterances in the sample from FIG. 7.

Referring to both FIGS. 6 and 7, an oracle stability point 601, 701 represents the stability and lag of an ideal set of prefixes of the incremental results in the test set. Curves 602, 603, 604, 702, 703, 704 represent stability threshold sweeps on regressions learned from three different feature sets. The first feature set indicated by curves 602, 702 is $c_w$, or the right context of a word. The second feature set indicated by curves 603, 703 is $a_w$, or the age of a word. In generating the plots 600, 700, intercept terms were allowed for the regression on each of these single-feature sets. In the examples of FIGS. 6 and 7, age is generally more indicative of stability than right context. This result may be intuitive because, even if a word has a large amount of right context, a young age can imply that the word has changed in the recent past and may change again. In addition to duration-based features, other word-related features, such as word-level posteriors, can be used. For example, a probability that a word is correct, $p_w$, given an acoustic evidence can be computed from a lattice representing current hypotheses and scores up to the last frame decoded. Additionally, or alternatively, a simple measurement, $s_w$, of a search space size at an exact moment a word w appears can be captured. Such a feature can capture roughly how large a search space is relative to how large it has been in the past.

Given that age can be more indicative of stability than right context based on the plots 600, 700, age can be combined with the other features in a third feature set. In addition to interaction terms such as $a_w \times p_w$ and $a_w \times s_w$, additional word-related features mentioned previously can be included. This choice of features, which includes features based on posteriors (P), age (A), words (W), and a search statistic (S), can be referred to as a PAWS feature set and is indicated by curves 604, 704.

For the sample test set shown in FIG. 6, the PAWS feature set achieves operating points closest to the oracle point 601. For the sample test set shown in FIG. 7, however, the improvements appear to be negligible. Differences in utterance lengths of the two sample test sets may be responsible for this variation. While the tradeoff analysis shown in FIGS. 6 and 7 can provide a clean picture of how the stability of a corpus of thresholded prefixes relates to the lag introduced, it may not explicitly show how accurate the stabilities themselves are.

Figure 8:
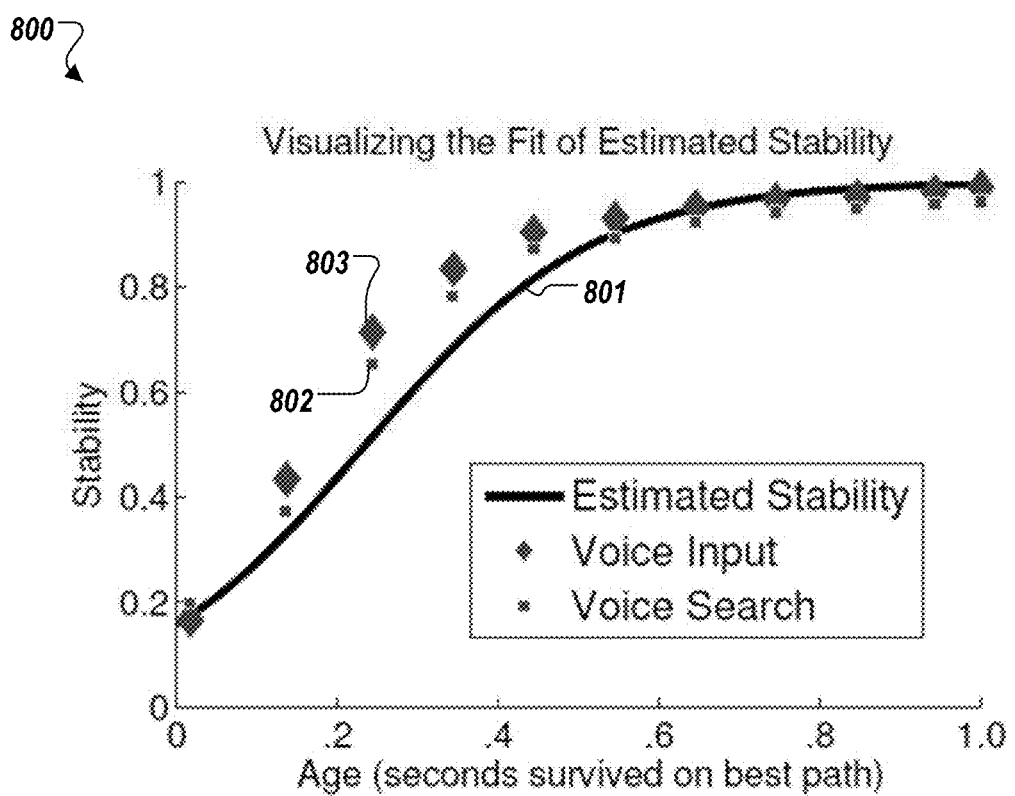
FIG. 8 illustrates an example regression curve that is derived using an age feature plotted against a true distribution of the sample test sets of FIGS. 6 and 7.

FIG. 8 illustrates an example regression curve 801 that is derived using an age feature plotted against a true distribution of the sample test sets of FIGS. 6 and 7. A sample test set 802 corresponds to the voice search utterances from FIG. 6, and a sample test set 803 corresponds to the voice input utterances from FIG. 7. In a sample plot 800, prefixes from the test sets, sampled in the same manner as the training set, are shown binned according to their age. The mean age of each evenly spaced bin are plotted against the fraction of prefixes that are stable in that bin. The binned test data shows that the learned curve 801 generally fits the true data 802, 803. For example, the sample plot 800 shows that probabilities below about 0.9 may be underestimated, but the higher probabilities are more accurate.

A more accurate estimate can be obtained by binning the feature-space itself. Additionally, there are numerous feature representations that can be used. The logistic regression framework can flexibly handle a large number of features while robustly handling data sparsity issues should they occur.

Embodiments of the subject matter, the functional operations and the processes described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible nonvolatile program carrier for execution by, or to control the operation of, data processing apparatus. Alternatively or in addition, the program instructions can be encoded on an artificially generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The term "data processing apparatus" encompasses all kinds of apparatus, devices, and machines for processing data, including by way of example a programmable processor, a computer, or multiple processors or computers. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, or a combination of one or more of them.

A computer program (which may also be referred to or described as a program, software, a software application, a module, a software module, a script, or code) can be written in any form of programming language, including compiled or interpreted languages, or declarative or procedural languages, and it can be deployed in any form, including as a stand alone program or as a module, component, subroutine, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Computers suitable for the execution of a computer program include, by way of example, can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous. Other steps may be provided, or steps may be eliminated, from the described processes. Accordingly, other implementations are within the scope of the following claims.

What is claimed is:

1. A computer-implemented method comprising:
receiving multiple, partial incremental speech recognition hypotheses that are each output by an incremental speech recognizer as top partial incremental speech recognition hypothesis at a different point in time;
identifying a segment that occurs in a particular one of the multiple, partial incremental speech recognition hypotheses;
determining a quantity of consecutive, partial incremental speech recognition hypotheses that (i) are output by the incremental speech recognizer as the top partial incremental speech recognition hypotheses at different points in time immediately after the one particular partial incremental speech recognition hypothesis is output, and (ii) include the segment;
and assigning, by one or more computers, a stability metric to the segment based on the quantity of consecutive, partial incremental speech recognition hypotheses that (i) are output by the incremental speech recognizer as the top partial incremental speech recognition hypotheses at different points in time immediately after the one particular partial incremental speech recognition hypothesis is output, and (ii) include the segment.

2. The method of claim 1, wherein assigning the stability metric to the segment is further based on a right context of the segment.

3. The method of claim 1, wherein the segment comprises a word or sub-word.

4. The method of claim 1, wherein the stability metric is assigned to the segment after the one particular partial incremental speech recognition hypothesis that includes the segment has been output by the incremental speech recognizer.

5. The method of claim 1, comprising:
receiving an audio signal corresponding to an utterance; and
performing incremental speech recognition on the audio signal to generate the multiple, partial incremental speech recognition hypotheses.

6. The method of claim 1, comprising:
displaying the segment that occurs in a particular one of the multiple, partial incremental speech recognition hypotheses on a user interface, the displayed segment having a visual characteristic;
determining that the stability metric of the segment satisfies a threshold; and
altering the visual characteristic of the displayed segment on the user interface only after determining that the stability metric satisfies the threshold.

7. The method of claim 1, comprising:
determining that the stability metric satisfies a threshold; and
translating the segment to a different language only after determining that the stability metric satisfies the threshold.

8. The method of claim 1, comprising:
determining that the stability metric satisfies a threshold; and
submitting the segment to a search engine as part of a search query only after determining that the stability metric satisfies the threshold.

9. The method of claim 1, comprising:
- determining that the stability metric satisfies a threshold; and
- displaying a representation of the segment on a user interface only after determining that the stability metric satisfies the threshold.

10. The method of claim 1, wherein the receiving, identifying, determining and assigning are performed by one or more computers.

11. The method of claim 1, wherein identifying the segment comprises identifying a particular segment that does not occur in a partial incremental speech recognition hypothesis that immediately precedes the one particular partial incremental speech recognition hypothesis.

12. The method of claim 1, comprising:
- determining that the stability metric of the segment from the particular one of the multiple, partial incremental speech recognition hypotheses satisfies a threshold;
- upon determining that the segment does not satisfy the threshold, displaying the segment on a user interface, the displayed segment having a first visual characteristic; and
- upon determining that the segment satisfies the threshold, displaying the segment on the user interface, the displayed segment having a second visual characteristic different from the first visual characteristic.

13. A system comprising:
- one or more computers and one or more storage devices storing instructions that are operable, if executed by the one or more computers, to cause the one or more computers to perform operations comprising:
  - receiving multiple, partial incremental speech recognition hypotheses that are each output by an incremental speech recognizer as a top partial incremental speech recognition hypothesis at a different point in time;
  - identifying a segment that occurs in a particular one of the multiple, partial incremental speech recognition hypotheses;
  - determining a quantity of consecutive, partial incremental speech recognition hypotheses that (i) are output by the incremental speech recognizer as the top partial incremental speech recognition hypotheses at different points in time immediately after the one particular partial incremental speech recognition hypothesis is output, and (ii) include the segment; and
  - assigning, by the one or more computers, a stability metric to the segment based on the quantity of consecutive, partial incremental speech recognition hypotheses that (i) are output by the incremental speech recognizer as the top partial incremental speech recognition hypotheses at different points in time immediately after the one particular partial incremental speech recognition hypothesis is output, and (ii) include the segment.

14. The system of claim 13, wherein assigning the stability metric to the segment is further based on a right context of the segment.

15. The system of claim 13, wherein the segment comprises a word or sub-word.

16. The system of claim 13, wherein the stability metric is assigned to the segment after the one particular partial incremental speech recognition hypothesis that includes the segment has been output by the incremental speech recognizer.

17. The system of claim 13, wherein the operations comprise:
- receiving an audio signal corresponding to an utterance; and
- performing incremental speech recognition on the audio signal to generate the multiple, partial incremental speech recognition hypotheses.

18. The system of claim 13, wherein the operations comprise:
- displaying the segment that occurs in a particular one of the multiple, partial incremental speech recognition hypotheses on a user interface, the displayed segment having a visual characteristic;
- determining that the stability metric of the segment satisfies a threshold; and
- altering the visual characteristic of the displayed segment on the user interface only after determining that the stability metric satisfies the threshold.

19. The system of claim 13, wherein the operations comprise:
- determining that the stability metric satisfies a threshold; and
- submitting the segment to a search engine as part of a search query only after determining that the stability metric satisfies the threshold.

20. The method of claim 13, wherein the operations comprise:
- determining that the stability metric satisfies a threshold; and
- displaying a representation of the segment on a user interface only after determining that the stability metric satisfies the threshold.

21. The system of claim 13, wherein identifying the segment comprises identifying a particular segment that does not occur in a partial incremental speech recognition hypothesis that immediately precedes the one particular partial incremental speech recognition hypothesis.

22. A computer-readable storage device storing software comprising instructions executable by one or more computers, which, upon such execution, cause the one or more computers to perform operations comprising:
- receiving multiple, partial incremental speech recognition hypotheses that are each output by an incremental speech recognizer as a top partial incremental speech recognition hypothesis at a different point in time;
- identifying a segment that occurs in a particular one of the multiple, partial incremental speech recognition hypotheses;
- determining a quantity of consecutive, partial incremental speech recognition hypotheses that (i) are output by the incremental speech recognizer as the top partial incremental speech recognition hypotheses at different points in time immediately after the one particular partial incremental speech recognition hypothesis is output, and (ii) include the segment; and
- assigning, by the one or more computers, a stability metric to the segment based on the quantity of consecutive, partial incremental speech recognition hypotheses that (i) are output by the incremental speech recognizer as the top partial incremental speech recognition hypotheses at different points in time immediately after the one particular partial incremental speech recognition hypothesis is output, and (ii) include the segment.

23. The device of claim 22, wherein assigning the stability metric to the segment is further based on a right context of the segment.

24. The device of claim 22, wherein the segment comprises a word or sub-word.

25. The device of claim 22, where the stability metric is assigned to the segment after the one particular partial incremental speech recognition hypothesis that includes the segment has been output by the incremental speech recognizer.

26. The device of claim 22, wherein the operations comprise:
   receiving an audio signal corresponding to an utterance; and
   performing incremental speech recognition on the audio signal to generate the multiple, partial incremental speech recognition hypotheses.

27. The device of claim 22, wherein the operations comprise:
   displaying the segment that occurs in a particular one of the multiple, partial incremental speech recognition hypotheses on a user interface, the displayed segment having a visual characteristic;
   determining that the stability metric of the segment satisfies a threshold; and
   altering the visual characteristic of the displayed segment on the user interface only after determining that the stability metric satisfies the threshold.

28. The device of claim 22, wherein the operations comprise:
   determining that the stability metric satisfies a threshold; and
   submitting the segment to a search engine as part of a search query only after determining that the stability metric satisfies the threshold.

29. The device of claim 22, wherein identifying the segment comprises identifying a particular segment that does not occur in a partial incremental speech recognition hypothesis that immediately precedes the one particular partial incremental speech recognition hypothesis.

* * * * *